(12) United States Patent
Hamamoto et al.

(10) Patent No.: US 11,899,356 B2
(45) Date of Patent: *Feb. 13, 2024

(54) REFLECTIVE FILM COATED SUBSTRATE, MASK BLANK, REFLECTIVE MASK, AND SEMICONDUCTOR DEVICE MANUFACTURING METHOD

(71) Applicant: HOYA CORPORATION, Tokyo (JP)

(72) Inventors: Kazuhiro Hamamoto, Tokyo (JP); Takashi Uchida, Tokyo (JP)

(73) Assignee: HOYA CORPORATION, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 17/958,088

(22) Filed: Sep. 30, 2022

(65) Prior Publication Data

US 2023/0025358 A1    Jan. 26, 2023

Related U.S. Application Data

(63) Continuation of application No. 17/008,949, filed on Sep. 1, 2020, now Pat. No. 11,500,281.

(30) Foreign Application Priority Data

Sep. 2, 2019  (JP) ................................. 2019-159908
Jul. 8, 2020  (JP) ................................. 2020-117891

(51) Int. Cl.
*G03F 1/24*    (2012.01)

(52) U.S. Cl.
CPC ..................................... *G03F 1/24* (2013.01)

(58) Field of Classification Search
CPC ........................................................ G03F 1/24
USPC ................................................................ 430/5
See application file for complete search history.

(56) References Cited

U.S. PATENT DOCUMENTS 11,500,281 B2 * 11/2022 Hamamoto ............... G03F 1/24
2010/0304283 A1   12/2010 Hayashi et al.

FOREIGN PATENT DOCUMENTS

WO     2009116348 A1    9/2009

OTHER PUBLICATIONS

U.S. Appl. No. 17/008,949, "Notice of Allowance", dated Sep. 1, 2020, 7 pages.

* cited by examiner

*Primary Examiner* — Christopher G Young
(74) *Attorney, Agent, or Firm* — Kilpatrick Townsend & Stockton LLP

(57) ABSTRACT

A reflective film coated substrate includes a substrate having two main surfaces opposite to each other and end faces connected to outer edges of the two main surfaces; and a reflective film formed on one of the main surfaces and extending onto at least part of the end faces. The reflective film on the main surface has a multilayer structure including low refractive index layers and high refractive index layers alternately formed. The reflective film which extends onto the end faces has a single-layer structure containing a first element higher in content than any other element in the low refractive index layers and a second element higher in content than any other element in the high refractive index layers.

19 Claims, 2 Drawing Sheets

REFLECTIVE FILM COATED SUBSTRATE, MASK BLANK, REFLECTIVE MASK, AND SEMICONDUCTOR DEVICE MANUFACTURING METHOD

CROSS-REFERENCE TO RELATED APPLICATIONS

This application is a continuation of U.S. application Ser. No. 17/008,949, filed Sep. 1, 2020, which claims priority to Japanese Patent Application No. 2019-159908 filed Sep. 2, 2019 and Japanese Patent Application No. 2020-117891 filed Jul. 8, 2020, the contents of which are incorporated herein by reference in their entirety.

TECHNICAL FIELD

This disclosure relates to a reflective film coated substrate, a mask blank, and a reflective mask which are for use in EUV lithography, and to a method for manufacturing a semiconductor device.

BACKGROUND ART

Generally, in a manufacturing process of a semiconductor device, a fine pattern is formed using a photolithography method. In forming the fine pattern, a number of transfer masks called photomasks are commonly used. The transfer mask generally comprises a transparent glass substrate and a fine pattern formed thereon and made of a metal thin film or the like. In manufacture of the transfer mask, the photolithography method is used also.

In recent years, in a semiconductor industry, higher integration of a semiconductor device requires a fine pattern exceeding a transfer limit in a related-art photolithography method using ultraviolet light. In order to enable formation of such a fine pattern, EUV lithography, which is an exposure technology using extreme ultra violet (hereinafter referred to as "EUV") light, is considered promising. Herein, the EUV light means light in a wavelength band of a soft X-ray region or a vacuum ultraviolet region, specifically, light having a wavelength in a range of about 0.2 nm to about 100 nm. As a mask for use in the EUV lithography, a reflective mask is proposed. The reflective mask comprises a substrate, a multilayer reflective film formed on the substrate to reflect exposure light, and an absorber film formed as a pattern on the multilayer reflective film to absorb the exposure light (for example, see WO2009/116348A1).

SUMMARY OF THE DISCLOSURE

Problem to be Solved by the Disclosure

In recent years, with an increasing demand for miniaturization in a lithography process, problems in the lithography process become salient and noticeable. One of the problems is adhesion of contamination to a mirror or a mask in an exposure device due to EUV light irradiation in an EUV lithography process.

In order to resolve the above-mentioned problem, a technique of suppressing the adhesion of contamination during EUV exposure by filling an interior of an exposure chamber with a hydrogen atmosphere such as hydrogen radicals, a cleaning method for removing contamination by hydrogen plasma, and so on come into use.

However, in case where the above-mentioned techniques are applied, there arises a new problem of occurrence of so-called "blisters" caused by hydrogen intruding into a film of the mask and agglomerating to generate bulges of the film. When the film bulges and raptures due to occurrence of the blisters, contamination by dust generation is caused in the interior of the exposure chamber. It has been found out that hydrogen intruding into the film is easily captured at an interface between the film and another film, although depending on a material of the film, and the blisters easily occur at the interface between the two layered films.

In the meanwhile, the reflective mask used in the EUV lithography comprises the reflective film formed on the substrate to reflect the exposure light (EUV light). The reflective film is a multilayer film having a structure in which low refractive index layers and high refractive index layers are alternately formed. The reflective film is formed on one main surface of the substrate, for example, by sputtering. In this case, the reflective film is not only formed on the one main surface of the substrate but also extends onto end faces of the substrate to be deposited thereon. If the reflective film deposited on the end faces of the substrate has a multilayer structure similar to that of the reflective film formed on the main surface, a risk of occurrence of the blisters is increased at an interface present in the multilayer film.

It is therefore a first aspect of this disclosure to provide a reflective film coated substrate and a mask blank which are capable of reducing occurrence of blisters, in particular, in a reflective film which extends onto end faces of a substrate.

It is a second aspect of this disclosure to provide a reflective mask which is manufactured using the mask blank mentioned above and which is capable of reducing occurrence of blisters, in particular, in a reflective film which extends onto end faces of a substrate.

It is another aspect of this disclosure to provide a method for manufacturing a semiconductor device using the above-mentioned reflective mask.

Means to Solve the Problem

In order to resolve the above-mentioned problem, the present inventors continued diligent studies, focusing on the structure of the reflective film spreading over and adhered onto the end faces of the substrate when the reflective film is formed on the main surface of the substrate. As a result, this disclosure has been completed.

Specifically, this disclosure has the following configurations in order to resolve the above-mentioned problem.

(Configuration 1)

A reflective film coated substrate comprising:
  a substrate having:
    two main surfaces opposite from each other; and
    end faces connected to outer edges of the two main surfaces; and
  a reflective film formed on one of the main surfaces as a multilayer structure comprising low refractive index layers and high refractive index layers alternately formed,
  wherein a content (atomic %) of a first element in the low refractive index layers is higher than a content (atomic %) of any other element in the low refractive index layers, and a content (atomic %) of a second element in the high refractive index layers is higher than a content (atomic %) of any other element in the high refractive index layers, the second element being a different element from the first element, and wherein the reflective film extends onto the end faces as a single layer that contains the first element and the second element.

(Configuration 2)
The reflective film coated substrate according to Configuration 1, wherein, in the reflective film that extends onto the end faces, a ratio of the content (atomic %) of the first element to the total content (atomic %) of the first element and the second element is less than 0.4.

(Configuration 3)
The reflective film coated substrate according to Configuration 1, wherein the film thickness of the reflective film that extends onto the end faces is smaller than the film thickness of the reflective film formed on the main surface.

(Configuration 4)
The reflective film coated substrate according to Configuration 1, wherein the first element is molybdenum and the second element is silicon.

(Configuration 5)
The reflective film coated substrate according to Configuration 1, wherein the reflective film that extends onto the end faces has surface roughness (root mean square roughness) Rq of 1.5 nm or more.

(Configuration 6)
A mask blank comprising:
a substrate having:
  two main surfaces opposite from each other; and
  end faces connected to outer edges of the two main surfaces; and
a reflective film formed on one of the main surfaces as a multilayer structure comprising low refractive index layers and high refractive index layers alternately formed; and
a pattern-forming thin film formed on the reflective film,
wherein a content (atomic %) of a first element in the low refractive index layers is higher than a content (atomic %) of any other element in the low refractive index layers, and a content (atomic %) of a second element in the high refractive index layers is higher than a content (atomic %) of any other element in the high refractive index layers, the second element being a different element from the first element, and
wherein the reflective film extends onto the end faces as a single layer that contains the first element and the second element.

(Configuration 7)
The mask blank according to Configuration 6, wherein, in the reflective film that extends onto the end faces, a ratio of the content (atomic %) of the first element to the total content (atomic %) of the first element and the second element is less than 0.4.

(Configuration 8)
The mask blank according to Configuration 6, wherein the film thickness of the reflective film that extends onto the end faces is smaller than the film thickness of the reflective film formed on the main surface.

(Configuration 9)
The mask blank according to Configuration 6, wherein the first element is molybdenum and the second element is silicon.

(Configuration 10)
The mask blank according to Configuration 6, wherein the reflective film that extends onto the end faces has surface roughness (root mean square roughness) Rq of 1.5 nm or more.

(Configuration 11)
A reflective mask comprising:
a substrate having:
  two main surfaces opposite to each other; and
  end faces connected to outer edges of the two main surfaces;
a reflective film formed on one of the main surfaces as a multilayer structure comprising low refractive index layers and high refractive index layers alternately formed; and
a thin film formed on the reflective film and having a transfer pattern;
wherein a content (atomic %) of a first element in the low refractive index layers is higher than a content (atomic %) of any other element in the low refractive index layers, and a content (atomic %) of a second element in the high refractive index layers is higher than a content (atomic %) of any other element in the high refractive index layers, the second element being a different element from the first element, and
wherein the reflective film extends onto the end faces as a single layer that contains the first element and the second element.

(Configuration 12)
The reflective mask according to Configuration 11, wherein, in the reflective film that extends onto the end faces, a ratio of the content (atomic %) of the first element to the total content (atomic %) of the first element and the second element is less than 0.4.

(Configuration 13)
The reflective mask according to Configuration 11, wherein the film thickness of the reflective film that extends onto the end faces is smaller than the film thickness of the reflective film formed on the main surface.

(Configuration 14)
The reflective mask according to Configuration 11, wherein the first element is molybdenum and the second element is silicon.

(Configuration 15)
The reflective mask according to Configuration 11, wherein the reflective film that extends onto the end faces has surface roughness (root mean square roughness) Rq of 1.5 nm or more.

(Configuration 16)
A method for manufacturing a semiconductor device, comprising transferring, by exposure, a transfer pattern onto a resist film on a semiconductor substrate by using the reflective mask according to Configuration 11.

Effect of the Disclosure

According to this disclosure, the reflective film on the end faces has the single-layer structure containing the first element greater in content than any other element in the low refractive index layers and the second element greater in content than any other element in the high refractive index layers. It is therefore possible to provide the reflective film coated substrate and the mask blank which are capable of reducing occurrence of blisters, in particular, in the reflective film which extends onto the end faces of the substrate.

Moreover, according to this disclosure, it is possible to provide, by using the above-mentioned mask blank, the reflective film capable of reducing occurrence of blisters, in particular, in the reflective film which extends onto the end faces of the substrate.

DESCRIPTION OF THE EMBODIMENTS

Now, embodiments of this disclosure will be described in detail.

[Reflective Film Coated Substrate]

At first, description will be made of a reflective film coated substrate according to an embodiment of this disclosure.

Figure 1:
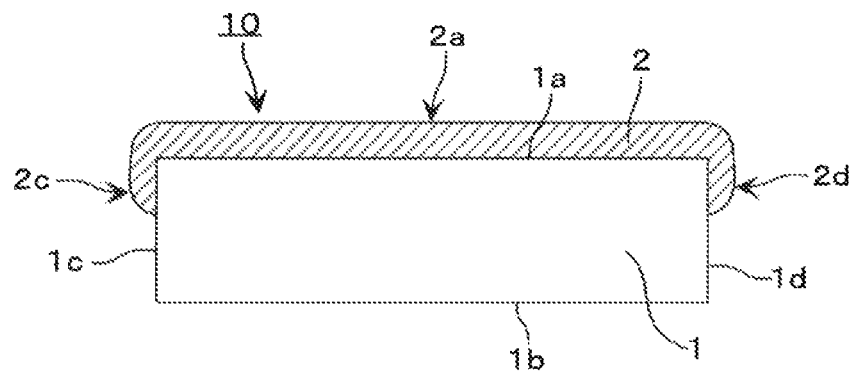
FIG. 1 is a sectional view for illustrating a structure of a reflective film coated substrate according to one embodiment of this disclosure.

FIG. 1 is a sectional view for illustrating a structure of the reflective film coated substrate according to one embodiment of this disclosure.

As illustrated in FIG. 1, the reflective film coated substrate 10 according to the one embodiment of this disclosure comprises a substrate 1 and a reflective film 2.

The substrate 1 has two main surfaces 1a and 1b opposite to each other, and end faces 1c and 1d connected to outer edges of the two main surfaces 1a and 1b.

The substrate 1 used in this disclosure has a rectangular shape as a whole and therefore has four end faces connected to the outer edges of the two main surfaces 1a and 1b. In this disclosure, the "end faces" refer to those four end faces. In the sectional view of FIG. 1, among the four end faces, only the two end faces 1c and 1d opposite to each other in left and right directions of the substrate 1 are illustrated. Although not shown in the figure, the substrate 1 has two other end faces opposite to each other in forward and backward directions of the substrate 1. Accordingly, the reflective film 2 extends onto at least part of the two other end faces not shown in FIG. 1. In the following, this embodiment will be described as regards the two end faces 1c and 1d for convenience of description but similar description also applies to the two other end faces opposite to each other.

The reflective film 2 is formed over the whole of the one main surface 1a and extends onto at least part of the end faces 1c and 1d. Specifically, the reflective film 2 includes a reflective film 2a formed on the main surface 1a and reflective films 2c and 2d which extend onto the end faces 1c and 1d, respectively.

Figure 2:
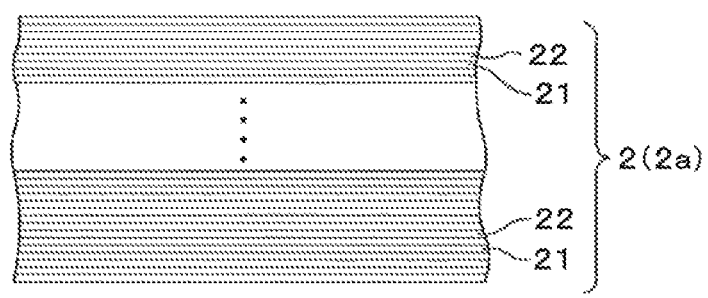
FIG. 2 is a sectional view for illustrating a film structure of a reflective film illustrated in FIG. 1.

As illustrated in FIG. 2, the reflective film 2a formed on the main surface 1a has a multilayer structure in which low refractive index layers 21 and high refractive index layers 22 are alternately formed. In the present specification, a low refractive index and a high refractive index are based on a refractive index with respect to a wavelength of EUV light.

Each of the reflective films 2c and 2d which extend onto the end faces 1c and 1d has a single-layer structure containing a first element in the low refractive index layers 21 and a second element in the high refractive index layers 22. A content (atomic %) of the first element in the low refractive index layers 21 is higher than a content (atomic %) of any other element in the low refractive index layers 21, and a content (atomic %) of the second element in the high refractive index layers 22 is higher than a content (atomic %) of any other element in the high refractive index layers 22. The second element is a different element from the first element.

Herein, the first element in the low refractive index layers 21 preferably has a content more than 50 atomic %, more preferably 70 atomic % or more, further preferably 90 atomic % or more. Similarly, the second element in the high refractive index layers 22 preferably has a content more than 50 atomic %, more preferably 70 atomic % or more, further preferably 90 atomic % or more.

In another aspect, each of the reflective films 2c and 2d which extend onto the end faces 1c and 1d may have a single-layer structure comprising a material which is a mixture of a main constituent element of the low refractive index layers 21 and a main constituent element of the high refractive index layers 22.

Herein, the "main constituent element" of the low refractive index layers 21 (high refractive index layers 22) refer to a constituent element or elements except those elements having a total content less than 5 atomic % in the low refractive index layers 21 (high refractive index layers 22). Thus, in this case, the total content of the "main constituent element" in the low refractive index layers 21 (high refractive index layers 22) is 95 atomic % or more. Therefore, even if the formed reflective film contains impurity components contained in a target material and/or impurity components derived from a structure such as a shield in a film-forming chamber, those impurity components are not included in the main constituent element of the low refractive index layers 21 or the high refractive index layers 22.

In case of EUV exposure, the substrate 1 preferably has a low thermal expansion coefficient in a range of $0 \pm 1.0 \times 10^{-7}/°$ C., more preferably in a range of $0 \pm 0.3 \times 10^{-7}/°$ C. in order to prevent deformation of a pattern due to heat during exposure. As a material having the low thermal expansion coefficient in the above-mentioned range, for example, a $SiO_2$—$TiO_2$-based glass, multicomponent glass ceramics, and so on may be used.

In case where a glass substrate of the above-mentioned material is used as the substrate 1, the main surface of the glass substrate on which a transfer pattern is to be formed is surface-treated so as to have high flatness in view of obtaining at least transfer accuracy and positional accuracy. In case of the EUV exposure, the main surface of the glass substrate on which the transfer pattern is to be formed preferably has flatness of 0.1 μm or less, more preferably 0.05 μm or less, in an area of 132 mm×132 mm or an area of 142 mm×142 mm. The other main surface of the glass substrate opposite from the main surface on which the transfer pattern is to be formed is a surface to be held by electrostatic chucking when the glass substrate is set in an exposure device, and has flatness of 1 μm or less, preferably 0.5 μm or less, in an area of 142 mm×142 mm.

The reflective film 2 is a multilayer film in which the low refractive index layers 21 and the high refractive index layers 22 are alternately formed. Generally, the multilayer film is used which comprises thin films of a heavy element or a compound thereof and thin films of a light element or a compound thereof alternately formed as layers in about 40 to 60 periods.

For example, as the reflective film for the EUV light having a wavelength of 13 to 14 nm, a Mo/Si periodic multilayer film comprising Mo films (low refractive index layers) and Si films (high refractive index layers) are alternately formed in 40 periods or more is preferably used. Besides, as the multilayer reflective film for use in a wavelength region of the EUV light, there are a Ru/Si periodic multilayer film, a Mo/Be periodic multilayer film, a Mo-compound/Si-compound periodic multilayer film, a Si/Nb periodic multilayer film, a Si/Mo/Ru periodic multilayer film, a Si/Mo/Ru/Mo periodic multilayer film, a Si/Ru/Mo/Ru periodic multilayer film, and so on. Depending on an exposure wavelength, the material of the reflective film 2 may appropriately be selected. The reflective film 2 may be formed by, for example, ion beam sputtering or atomic layer deposition (ALD).

In order to resolve the above-mentioned problem, the present inventors conducted diligent studies, focusing on the structure of the reflective film spread over and adhered to the end faces of the substrate when the reflective film is formed on the main surface of the substrate. As a result, it has been found out that the reflective film adhered to the end faces of the substrate do not require a reflecting function for the exposure light at all and, therefore, need not have a multilayer structure similar to the reflective film formed on the main surface of the substrate. Furthermore, it has been found out that, in view of reducing occurrence of blisters, being a film having a single-layer structure without any interface in the film leads to solution of the problem.

In the reflective film coated substrate 10 according to this embodiment mentioned above, the reflective film 2c (or 2d) which extends onto the end face 1c (or 1d) of the substrate 1 when the reflective film 2 is formed on the main surface 1a of the substrate 1, has the single-layer structure containing the first element (for example, molybdenum) and the second element (for example, silicon). The reflective film 2c (or 2d) is formed by mixing and dispersing at least the first element and the second element. The above-mentioned reflective film 2c (or 2d) is a film having the single-layer structure without any clear interface.

In another aspect, the reflective film 2c (or 2d) is formed by mixing and dispersing film forming materials of the reflective film 2, i.e., the main constituent element (for example, molybdenum) of the low refractive index layers 21 and the main constituent element (for example, silicon) of the high refractive index layers 22, and is a film of a single-layer structure without an interface.

Accordingly, even when the technique of reducing adhesion of contamination by hydrogen radicals or hydrogen plasma is applied during the EUV exposure using a mask blank and a reflective mask, which will later be described, manufactured by using the reflective film coated substrate 10 in this embodiment, it is possible to significantly lower a risk of occurrence of the blisters.

The reflective film coated substrate according to this disclosure has a structure in which at least the reflective film 2 for reflecting the exposure light (for example, the EUV light) is formed on the substrate 1, as illustrated in FIG. 1. In addition, the reflective film coated substrate according to this disclosure may have a structure further comprising other film or films such as an underlayer, a protective film formed on the reflective film 2, and so on, as will later be described.

In the substrate 1 according to this embodiment illustrated in FIG. 1, the end faces connected to the outer edges of the two main surfaces 1a and 1b opposite to each other are substantially orthogonal to the two main surfaces 1a and 1b. In some cases, the end faces of the substrate have chamfered faces. Specifically, when each of the end faces of the substrate has a side surface substantially orthogonal to the two main surfaces, and two chamfered faces connecting the side surface and the outer edges of the two main surfaces and when the reflective film 2 is formed on at least part of the side surface and the chamfered faces, the "reflective film on the end faces" refers to the reflective film which extends onto at least part of the side surface and the chamfered faces.

Similarly, in the reflective film coated substrate 10 in this embodiment, it is preferable that the ratio (hereinafter referred to as the L/(L+H) ratio) of the content (L) [atomic %] to the total content (L+H) [atomic %] is preferably smaller than 0.4. In this case, the content (L) [atomic %] represents a content of the first element contained in the reflective film 2c (or 2d). The content (H) [atomic %] represents a content of the second element contained in the reflective film 2c (or 2d). The total content (L+H) [atomic %] represents a total content of the content (L) and the content (H).

The first element higher in content than any other element in the low refractive index layers 21 (main constituent element of the low refractive index layers 21) is, for example, molybdenum. The second element higher in content than any other element in the high refractive index layers 22 (main constituent element in the high refractive index layers 22) is, for example, silicon. In view of a reflectance, in the reflective film 2a formed on the main surface 1a of the substrate 1, a ratio of the total film thickness of the low refractive index layers 21 and the total film thickness of the high refractive index layers 22 is preferably 4:6 (i.e., the L/(L+H) ratio in the whole of the reflective film 2a formed on the main surface 1a is equal to 0.4).

On the other hand, the reflective film 2c (or 2d) which extends onto the end face 1c (or 1d) in this embodiment is a film of a single-layer structure containing the first element and the second element. Alternatively, the reflective film 2c (or 2d) is a film of a single-layer structure comprising a mixture of the main constituent element of the low refractive index layers 21 and the main constituent element of the high refractive index layers 22. As the element having the highest content in the low refractive index layer 21 (main constituent element in the low refractive index layers 21), a transition metal (for example, molybdenum) is often used. The first element higher in content than any other element in the low refractive index layers 21 (main constituent element of the low refractive index layers 21) is low in chemical resistance and easily dissolved from the single-layer film as compared with the second element higher in content than any other element in the high refractive index layers 22 (main constituent element of the high refractive index layers 22). In view of the above, the L/(L+H) ratio in the reflective film 2c (or 2d) which extends onto the end face 1c (or 1d) is preferably smaller than the L/(L+H) ratio in the entire reflective film 2a formed on the main surface 1a. The L/(L+H) ratio in the reflective film 2c (or 2d) which extends onto the end face 1c (or 1d) is preferably 0.33 or less, more preferably 0.3 or less. In particular, in case where the first element higher in content than any other element in the low refractive index layers 21 (main constituent element of the low refractive index layers 21) is a transition metal and the second element higher in content than any other element in the high refractive index layers 22 (main constituent element of the high refractive index layers 22) is silicon, chemical resistance is improved when the content of the transition metal is smaller than that given by the ratio of transition metal:silicon=1:2 which is a stoichiometrically stable ratio of a transition metal silicide based material.

The film thickness of the reflective film 2 which extends onto the end face 1c (or 1d) (film thickness of the reflective film 2c (or 2d)) is desirably smaller than the film thickness of the reflective film 2 formed on the main surface 1a (film thickness of the reflective film 2a). If the film thickness of the reflective film 2 which extends onto the end face 1c (or 1d) is greater, a risk of dust generation due to film peeling at the end face 1c (or 1d) of the substrate 1 is increased. Furthermore, an interface is formed in the reflective film 2c (or 2d) with high possibility. The ratio of the film thickness of the reflective film 2c (or 2d) with respect to the film thickness of the reflective film 2a is preferably 0.4 or less, more preferably 0.3 or less.

The surface roughness (root mean square roughness) Rq of the reflective film 2c (or 2d) which extends onto the end face 1c (or 1d) is, for example, equal to 1.5 nm or more. Preferably, the surface roughness (root mean square roughness) Rq of the reflective film 2c (or 2d) is 2 nm or more. On the other hand, the surface roughness (root mean square roughness) Rq of the reflective film 2c (or 2d) preferably has a film thickness of 3 nm or less.

As described above, in the reflective film coated substrate 10 according to this embodiment, the reflective film 2c (or 2d) extends onto the end face 1c (or 1d) of the substrate 1 when the reflective film 2 is formed on the main surface 1a of the substrate 1 has a single-layer structure containing the first element (for example, molybdenum) and the second element (for example, silicon). The reflective film 2c (or 2d) is a film of the single-layer structure without any clear interface.

In another aspect, in the reflective film coated substrate 10 according to this embodiment, the reflective film 2c (or 2d) extends onto the end face 1c (or 1d) of the substrate 1 when the reflective film 2 is formed on the main surface 1a of the substrate 1 is a film of a single-layer structure in which the main constituent element (for example, molybdenum) of the low refractive index layers 21 that is the film-forming material of the reflective film 2 and the main constituent element (for example, silicon) of the high refractive index layers 22 that is the film-forming material of the reflective film 2 are mixed and dispersed without any interface.

Therefore, even if the technique of reducing the adhesion of contamination by hydrogen radicals or hydrogen plasma is applied during the EUV exposure using a reflective mask manufactured by using the reflective film coated substrate 10 according to this embodiment, a risk of occurrence of the blisters can significantly be reduced.

[Mask Blank]

Next, description will be made of a mask blank according to this disclosure.

The mask blank according to this disclosure comprises a substrate having two main surfaces opposite to each other and end faces connected to outer edges of the two main surfaces, a reflective film formed on one of the main surfaces and extending onto at least part of the end faces, and a pattern-forming thin film formed on the reflective film. The reflective film formed on the main surface has a structure comprising low refractive index layers and high refractive index layers alternately formed. The reflective film which extends onto the end faces has a single-layer structure containing a first element in the low refractive index layers and a second element in the high refractive index layers. A content (atomic %) of the first element in the low refractive index layers is higher than a content (atomic %) of any other element in the low refractive index layers, and a content (atomic %) of the second element in the high refractive index layers is higher than a content (atomic %) of any other element in the high refractive index layers. The second element is a different element from the first element.

In another aspect, a mask blank according to this disclosure comprises a substrate, a reflective film, and a pattern-forming thin film. The substrate has two main surfaces opposite to each other and end faces connected to outer edges of the two main surfaces. The reflective film is formed on one of the main surfaces and extends onto at least part of the end faces. The reflective film formed on the main surface has a structure comprising low refractive index layers and high refractive index layers alternately formed. The reflective film on the end faces has a single-layer structure containing a material which is a mixture of a main constituent element of the low refractive index layers and a main constituent element of the high refractive index layers. The pattern-forming thin film is formed on the reflective film.

The mask blank according to this disclosure essentially has a film structure in which at least the reflective film for reflecting exposure light (for example, EUV light) and the pattern-forming thin film are formed on the substrate. The mask blank may have a structure further comprising other films, such as an underlayer, a protective film formed on the reflective film, an etching mask film formed on the pattern-forming thin film, which will later be described. The pattern-forming thin film may be an absorber film for absorbing the EUV light. Alternatively, the pattern-forming thin film may be a phase shift film having a function of transmitting the EUV light at a predetermined transmittance and a function of causing a predetermined phase difference between the EUV light passing through the thin film, reflected at an interface between the thin film and the reflective film, and emitted from the thin film again and the EUV light passing through vacuum and directly reflected by the reflective film.

The mask blank according to this disclosure is also characterized in that the reflective film is formed on one of the main surfaces and extends onto at least part of the end faces, that the reflective film on the main surface has a structure comprising the low refractive index layers and the high refractive index layers alternately formed, that the reflective film on the end faces has a single-layer structure containing a material which is a mixture of the main constituent element of the low refractive index layers and the main constituent element of the high refractive index layers. These characteristics are already explained above in the section entitled Reflective Film Coated Substrate and repeated description is omitted herein.

In the mask blank according to this disclosure, the following matters are similar to those in case of the Reflective Film Coated Substrate mentioned above and description thereof will be omitted herein.

(1) The ratio (L/(L+H) ratio) of the content (L) [atomic %] to the total content (L+H) [atomic %) is smaller than 0.4.

(2) The film thickness of the reflective film which extends onto the end faces is smaller than the film thickness of the reflective film formed on the main surface.

(3) The low refractive index layers are formed of a material containing, for example, molybdenum whereas the high refractive index layers are formed of a material containing, for example, silicon.

(4) The surface roughness (root mean square roughness) Rq of the reflective film which extends onto the end faces is 1.5 nm or more.

(5) Other matters related to (1) to (4).

Figure 3:
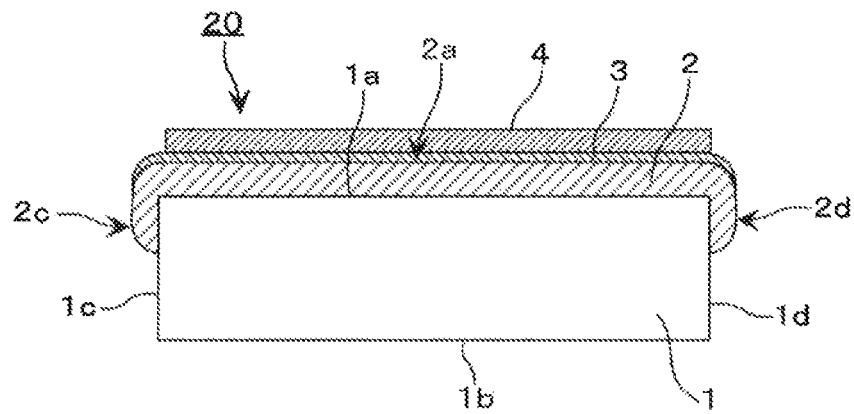
FIG. 3 is a sectional view for illustrating a structure of a mask blank according to one embodiment of this disclosure.

FIG. 3 is a sectional view for illustrating a structure of the mask blank according to one embodiment of this disclosure. In FIG. 3, parts similar to those in FIG. 1 are designated by the same reference numerals.

The mask blank 20 according to the one embodiment of this disclosure illustrated in FIG. 3 comprises a substrate 1, a reflective film 2 formed on the substrate 1 to reflect, for example, EUV light, a protective film 3, and a pattern-forming thin film 4. In this embodiment, description will be made of a case where the pattern-forming thin film 4 is an absorber film for absorbing exposure light (for example, EUV light).

In case of EUV exposure, a glass substrate, such as a $SiO_2$—$TiO_2$-based glass, having a low thermal expansion coefficient is preferably used as the substrate 1 as described above. However, in such glass substrate, it may sometimes be difficult to achieve, as surface roughness, high flatness of 0.1 nm or less in RMS (Root Mean Square) roughness (Rq) by precision polishing. Therefore, for the purpose of reducing the surface roughness of the glass substrate or reducing defects on a surface of the glass substrate, it is preferable to form the underlayer (not shown) on the surface of the glass substrate (the above-mentioned substrate 1). As a material of the underlayer, a light transparency with respect to the exposure light is not required and a material which would be high in flatness and excellent in quality when a surface of the underlayer is precision-polished is preferably selected. For example, Si or a silicon compound containing Si (for example, $SiO_2$, SiON, and so on) is preferably used because high flatness is obtained and the quality is excellent when precision-polishing is carried out. As the material of the underlayer, Si is particularly preferable.

Preferably, the surface of the underlayer is precision-polished so as to have flatness required as a mask blank substrate. It is desired that the surface of the underlayer is precision-polished to have surface roughness of 0.15 nm or less, particularly preferably 0.1 nm or less in root mean square roughness (Rq). Taking into account an influence on the surface of the reflective film 2 formed on the underlayer, it is desired that the surface of the underlayer is precision-polished so that, in the relationship between the root square mean roughness and the maximum surface roughness, Rmax/Rq is 2 to 10, particularly preferably 2 to 8. The film thickness of the underlayer is preferably in a range of, for example, 75 nm to 300 nm.

Generally, for the purpose of protecting the reflecting film 2 during patterning or pattern repairing of the pattern-forming thin film 4, the protective film 3 is desirably formed between the reflective film 2 and the pattern-forming thin film 4 as in this embodiment.

The protective film 3 is formed on the reflective film 2 in order to protect the reflective film 2 from dry etching and cleaning in a manufacturing process of a reflective mask 30 which will later be described. Furthermore, the protective film 3 may protect the reflective film 2 during black defect repair (EB defect repair) of a transfer pattern using an electron beam (EB). The protective film 3 may have a layered structure of three layers or more. For example, the protective film 3 may have a structure comprising a lowermost layer, an uppermost layer, and an intermediate layer interposed between the lowermost layer and the uppermost layer. Each of the lowermost layer and the uppermost layer is formed of a metal containing ruthenium (Ru). The intermediate layer is a metal layer of a metal except Ru or an alloy layer of a metal except Ru. The protective film 3 is formed of, for example, a material containing Ru as a main component. The material containing Ru as a main component may be Ru elemental metal or an Ru alloy containing Ru and titanium (Ti), niobium (Nb), molybdenum (Mo), zirconium (Zr), yttrium (Y), boron (B), lanthanum (La), cobalt (Co), and/or rhenium (Re) added thereto. The material of the protective film 3 may further contain nitrogen. The protective film 3 is effective in case where the pattern-forming thin film 4 is patterned by dry etching using a Cl-based gas.

The thickness of the protective film 3 is not particularly limited as far as the function as the protective film 3 is satisfied. In view of reflectance for the EUV light, the thickness of the protective film 3 is preferably 1.0 nm to 8.0 nm, more preferably 1.5 nm to 6.0 nm.

The protective film 3 may be formed on the reflective film 2c (or 2d) which extends onto the end face 1c (or 1d) but is not essential. The reflective film 2c (or 2d) on the end face 1c (or 1d) is, in many cases, not surmounted by or not coated with the pattern-forming thin film 4, and is hardly affected by dry etching or EB defect repair. Furthermore, the reflective film 2c (or 2d) is a film of a single-layer structure comprising a material which is a mixture of the main constituent element of the low refractive index layers and the main constituent element of the high refractive index layers and is high in resistance against the dry etching or the EB defect repair, including chemical resistance. From the above, the necessity for forming the protective film 3 on the reflective film 2c (or 2d) is low. A surface layer (for example, a region from the surface to a depth or 5 nm or less) of the reflective film 2c (or 2d) may have a composition with a constituent element of the protective film 3 mixed therein.

In the mask blank 20 according to this embodiment, the pattern-forming thin film 4 may be a single-layer film or a multilayer film comprising a plurality of films. In case of the single-layer film, there is an advantage that the number of steps during manufacture of the mask blank can be reduced and production efficiency is increased. In case of the multilayer film, it is possible to appropriately set an optical constant and a film thickness so that the thin film of an upper layer serves as an antireflection film during inspection of mask pattern defects using light. This improves inspection sensitivity during inspection of mask pattern defects using light. If a film added with oxygen (O), nitrogen (N), and so on which improve oxidation resistance is used as the thin film of the upper layer, stability with time is improved.

A material of the pattern-forming thin film 4 is not particularly limited as far as the material has a function of absorbing the EUV light and is processable by etching or the like (preferably etchable by dry etching using a chlorine (Cl) based gas and/or a fluorine (F) based gas). As the material having such a function, elemental tantalum (Ta) or a material containing Ta may preferably be used.

The material containing Ta may be, for example, a material containing Ta and B, a material containing Ta and N, a material containing Ta, B, and at least one of O and N, a material containing Ta and Si, a material containing Ta, Si, and N, a material containing Ta and Ge, a material containing Ta, Ge, and N, a material containing Ta and Pd, a material containing Ta and Ru, a material containing Ta and Ti, and so on.

For example, the pattern-forming thin film 4 may be formed of a material containing at least one selected from a group including elemental Ni, a material containing Ni, elemental Cr, a material containing Cr, elemental Ru, a material containing Ru, elemental Pd, a material containing Pd, elemental Mo, and a material containing Mo.

The pattern-forming thin film 4 may be formed by, for example, sputtering. The film thickness of the pattern-forming thin film is preferably within a range of, for example, 25 nm to 70 nm.

On the pattern-forming thin film 4, an etching mask film may be provided. By providing the etching mask film, a resist film formed on the absorber film (pattern-forming thin film) upon patterning the pattern-forming thin film 4 can be reduced in film thickness. Therefore, it is possible to form a fine pattern in the pattern-forming thin film 4 with high accuracy.

The etching mask film is formed of a material having etching selectivity with respect to the pattern-forming thin film 4. In case where the absorber film (pattern-forming thin film) is formed of the above-mentioned tantalum-based material, the etching mask film is preferably formed of, for example, a chromium-based material. The chromium-based material may be, for example, elemental chromium (Cr) or a chromium compound (chromium oxide, chromium nitride, chromium oxynitride, chromium carbide, and so on).

The etching mask film may be formed by, for example, sputtering. The film thickness of the etching mask film preferably falls within a range between 5 nm and 15 nm.

The above-described mask blank 20 according to this embodiment as illustrated in FIG. 3 may be manufactured by sequentially forming, on the substrate 1, the reflective film 2, the protective film 3, and the pattern-forming thin film 4. If necessary, an underlayer (not shown) may be formed between the substrate 1 and the reflective film 2. If necessary, an etching mask film (not shown) may be formed on the pattern-forming thin film 4.

Also in the above-mentioned mask blank 20 according to this embodiment, the reflective film which extends onto the end faces of the substrate 1 when the reflective film 2 is formed on the main surface of the substrate 1 is a film of a single-layer structure in which the film-forming materials of the reflective film 2, for example, Si and Mo, are mixed and dispersed without any interface. Therefore, even if the technique of reducing adhesion of contamination using hydrogen radicals or hydrogen plasma is applied during EUV exposure, it is possible to significantly reduce a risk of occurrence of blisters.

[Reflective Mask]

Next, description will be made of a reflective mask according to an embodiment of this disclosure.

The reflective mask according to this disclosure is characterized in that a transfer pattern is formed in the pattern-forming thin film of the mask blank having the above-mentioned structure.

Figure 4:
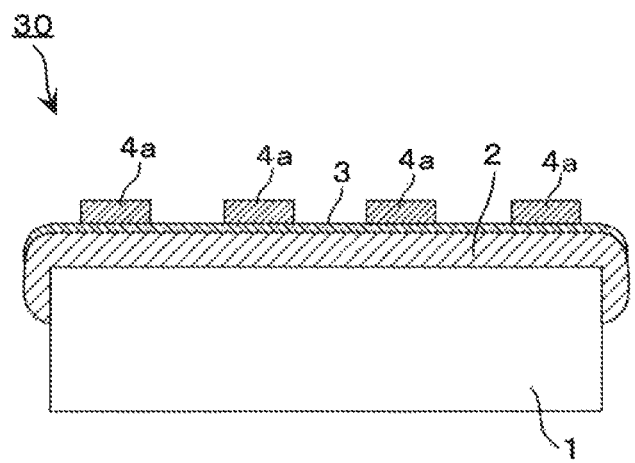
FIG. 4 is a sectional view for illustrating a structure of a reflective mask manufactured by using the mask blank according to this disclosure.

FIG. 4 is a sectional view for illustrating a structure of the reflective mask manufactured using the mask blank according to this disclosure. In FIG. 4, parts equivalent to those in FIG. 1 or FIG. 3 described above are designated by the same reference numerals.

The reflective mask 30 illustrated in FIG. 4 has the transfer pattern 4a formed by patterning the pattern-forming thin film 4 of the above-mentioned mask blank 20 illustrated in FIG. 3.

For example, photolithography is most preferable as a method of patterning the pattern-forming thin film 4 of the above-mentioned mask blank 20. Specifically, in order to obtain the reflective mask in this disclosure, it is preferable to use a manufacturing method at least comprising a step of forming a resist film on a surface of the mask blank 20 by using the above-mentioned mask blank 20, a step of forming a resist pattern in the resist film by electron beam writing and development, and a step of patterning the pattern-forming thin film 4 by dry etching with the resist pattern used as a mask.

Also in the above-described reflective mask 30 according to this embodiment, the reflective film which extends onto the end faces of the substrate 1 when the reflective film 2 is formed on the main surface of the substrate 1 is a film of a single-layer structure in which the film-forming materials of the reflective film 2, for example, Si and Mo, are mixed and dispersed without any interface. Therefore, even if the technique of reducing adhesion of contamination using hydrogen radicals or hydrogen plasma is applied during EUV exposure using the reflective mask 30, it is possible to significantly reduce a risk of occurrence of blisters.

[Method for Manufacturing Semiconductor Device]

This disclosure also provides a method for manufacturing a semiconductor device, comprising a step of transferring by exposure a transfer pattern onto a resist film on a semiconductor substrate using the above-mentioned reflective mask.

By using the reflective mask according to this disclosure, even if the technique of reducing adhesion of contamination using hydrogen radicals or hydrogen plasma is applied during EUV exposure, it is possible to significantly reduce a risk of occurrence of blisters. Thus, according to this disclosure, it is possible to perform excellent pattern transfer and to manufacture a high-quality semiconductor device with a high-accuracy device pattern formed thereon.

EXAMPLES

Hereinafter, the embodiment of this disclosure will be described more in detail with reference to examples.

Example 1

A $SiO_2$—$TiO_2$-based glass substrate (having a size of about 152.4 mm×about 152.4 mm and a thickness of about 6.35 mm) was prepared whose surfaces were polished stepwise using a double-sided polishing device and cerium oxide abrasive grains or colloidal silica abrasive grains and surface-treated using low-concentration hydrofluosilicic acid. The glass substrate 1 thus obtained had surface roughness of 0.20 nm in root mean square roughness (Rq). The surface roughness was measured by an atomic force microscope (AFM) and a measurement area was 1 μm×1 μm.

Next, a conductive backside film (not shown) having a layered structure including a lower layer of CrON and an upper layer of CrN was formed on a main surface 1b (main surface opposite from a main surface 1a on which a reflective film 2 is to be formed) of the glass substrate 1. The lower layer (CrON layer) was formed to a film thickness of 15 nm by reactive sputtering (DC magnetron sputtering) using a Cr target in an atmosphere of a mixture of an Ar gas, an $N_2$ gas, and an $O_2$ gas. The upper layer (CrN layer) was formed to a film thickness of 180 nm by reactive sputtering (DC magnetron sputtering) using a Cr target in an atmosphere of a mixture of an Ar gas and an $N_2$ gas. The composition (atomic %) of the CrN layer was measured by X-ray photoelectronic spectroscopy (XPS). As a result, the atomic ratio was 91 atomic % for chromium (Cr) and 9 atomic % for nitrogen (N).

Next, on the main surface 1a of the glass substrate 1, a reflective film 2 (having a total film thickness of 280 nm) comprising a multilayer film including 40 periods of layers was formed by using an ion beam sputtering device where one period comprises a Si film (having a film thickness of 4.2 nm) as a high refractive index layer and a Mo film (having a film thickness of 2.8 nm) as a low refractive index layer. Specifically, the conductive backside film of the glass substrate 1 was fixed by an electrostatic chuck to a stage of the ion beam sputtering device. Sputtering particles (Si particles and Mo particles) were incident to the main surface 1a of the glass substrate 1 in an oblique direction to be deposited on the main surface 1a and the end faces 1c and 1d to form the reflective film 2. During the deposition, the end faces 1c and 1d of the glass substrate 1 were not masked with a shield or the like. Through the above-mentioned steps, a reflective film coated substrate in Example 1 was obtained The above-mentioned reflective film was not only formed on the main surface 1a of the glass substrate 1 but also extends onto the end faces (four end faces including 1c and 1d) of the glass substrate 1. The reflective film which extends onto the end faces of the glass substrate 1 was analyzed using a transmission electron microscope (TEM). As a result, it was confirmed that the film thickness (about 40 nm) of the reflective film 2 which extends onto the end faces was smaller than the film thickness of the reflective film 2 formed on the main surface 1a. It was also confirmed that the reflective film on the end faces of the glass substrate 1 had a single-layer structure, not a multilayer structure. Therefore, the reflective film on the end faces of the glass substrate 1 does not have a reflecting function for exposure light. Furthermore, the composition of the reflective film on the end faces of the glass substrate 1 was analyzed by an energy dispersive transmission electron microscope (TEM-EDX). As a result, it was confirmed that Si and Mo mentioned above were contained. Thus, the reflective film spread over and adhered onto the end faces of the glass substrate 1 when the reflective film 2 was formed on the main surface 1a of the glass substrate 1 was a film of a single-layer structure in which Si and Mo as film-forming materials of the reflective film 2 are mixed and dispersed without an interface.

The ratio L/(L+H) was equal to 0.25 where L represents the content [atomic %] of Mo contained in the reflective film which extends onto the end faces of the substrate 1 and being a main constituent element of the low refractive index layers and H represents the content [atomic %] of Si contained in the reflective film which extends onto the end faces of the substrate 1 and being a main constituent element of the high refractive index layers. The surface roughness (root mean square roughness) Rq of the reflective film which extends onto the end faces was 2 nm or more.

Next, in the manner similar to that mentioned above, a conductive backside film was formed on the main surface 1b of the glass substrate 1 and a reflective film comprising a multilayer film was formed by depositing 40 periods of Si films and Mo films. Thus, a reflective film coated substrate was obtained.

Next, using a DC magnetron sputtering device, a protective film (having a film thickness of 2.5 nm) of Ru and an absorber film comprising a multilayer film including a TaN film (having a film thickness of 48 nm, a composition of Ta:N=70 atomic %: 30 atomic %) and a TaO film (having a film thickness of 11 nm and a composition of Ta:O=35 atomic %: 65 atomic %) were formed on the reflective film of the reflective film coated substrate. Each composition was measured by X-ray photoelectron spectroscopy (XPS).

In the above-mentioned manner, the mask blank (reflective mask blank) was manufactured.

Next, using the above-mentioned mask blank, a reflective mask was manufactured.

At first, on a surface of the absorber film of the mask blank, a positive resist film for electron beam writing was formed as a resist film to a film thickness of 80 nm. The resist film was formed by spin coating using a spinner (spin coating device).

Next, after a predetermined mask pattern was written on the above-mentioned resist film by an electron beam writer, development was performed to form a resist pattern.

Next, with the resist pattern used as a mask, the TaO film of the absorber film was removed by etching using a fluorine-based gas ($CF_4$ gas). The TaN film of the absorber film was removed by etching using a chlorine-based gas ($Cl_2$ gas). Thus, an absorber film pattern was formed.

Furthermore, the resist pattern left on the absorber film pattern was removed by hot sulfuric acid to obtain the reflective mask for EUV lithography in Example 1. The reflective films 2c and 2d on the end faces 1c and 1d of the reflective mask in Example 1 were observed. As a result, it was confirmed that no distinct film reduction occurred.

In case where the reflective mask obtained as mentioned above is set in an EUV exposure device and pattern transfer is carried out onto a semiconductor substrate with a resist film formed thereon, it is desired, for example, to fill the interior of an exposure chamber with a hydrogen atmosphere such as hydrogen radicals in order to reduce adhesion of contamination to a mirror or the mask in the exposure device during EUV exposure, as described above. In case of the reflective mask in this example, as described above, the reflective film which extends onto the end faces of the glass substrate when the reflective film is formed on the main surface of the glass substrate does not have a multilayer structure but is a film of a single-layer structure in which Si and Mo as the film-forming materials of the reflective film are mixed and dispersed without an interface. Therefore, even if the technique of reducing adhesion of contamination using hydrogen radicals or hydrogen plasma is applied during EUV exposure, it is possible to significantly reduce a risk of occurrence of blisters. Therefore, excellent pattern transfer can be carried out according to this disclosure.

Comparative Example

In the manner similar to Example 1, a $SiO_2$—$TiO_2$-based glass substrate (having a size of about 152.4 mm×about 152.4 mm and a thickness of about 6.35 mm) was prepared whose surfaces were polished stepwise using a double-sided polishing device and cerium oxide abrasive grains or colloidal silica abrasive grains and surface-treated using low-concentration hydrofluosilicic acid. The glass substrate 1 thus obtained had surface roughness of 0.25 nm in root mean square roughness (Rq). The surface roughness was measured by an atomic force microscope (AFM) and a measurement area was 1 μm×1 μm.

Next, in the manner similar to Example 1, a conductive backside film (not shown) having a layered structure including a lower layer of CrON and an upper layer of CrN was formed on a main surface 1b of the glass substrate 1.

Next, on the main surface 1a of the glass substrate 1, a reflective film 2 (having a total film thickness of 280 nm) comprising a multilayer film including 40 periods of layers was formed by using an ALD (Atomic Layer Deposition) device (deposition device using atomic layer deposition) where one period comprises a Si film (having a film thickness of 4.2 nm) as a high refractive index layer and a Mo film (having a film thickness of 2.8 nm) as a low refractive index layer. Si particles and Mo particles were incident to the main surface 1a of the glass substrate 1 in an oblique direction to be deposited on the main surface 1a and the end faces 1c and 1d to form the reflective film 2. During the deposition, the end faces 1c and 1d of the glass substrate 1 were not masked with a shield or the like. Through the above-mentioned steps, a reflective film coated substrate in Comparative Example was obtained.

The above-mentioned reflective film was not only formed on the main surface of the glass substrate but also extends onto the end faces of the glass substrate. The structure of the reflective film on the end faces of the glass substrate was analyzed using a transmission electron microscope (TEM). As a result, it was confirmed that the reflective film on the end faces of the glass substrate had a multilayer structure, similar to the reflective film formed on the main surface, in which Si films and Mo films are alternately formed as layers. Thus, the reflective film spread over and adhered to the end faces of the glass substrate when the reflective film was formed on the main surface of the glass substrate was a film of a multilayer structure having an interface.

Next, in the manner exactly same as that mentioned above, a conductive backside film was formed on a main surface 1b of another glass substrate 1. On a main surface 1a, a reflective film comprising a multilayer film including 40 periods of Si films and Mo films was formed to obtain a reflective film coated substrate.

Next, in the manner similar to Example 1 mentioned above, a protective film of Ru and an absorber film comprising a multilayer film including a TaN film and a TaO film were formed on the reflective film of the reflective film coated substrate to manufacture a mask blank (reflective mask blank) of Comparative Example.

Next, using the mask blank, a reflective mask for EUV lithography in Comparative Example was manufactured in the manner similar to Example 1 mentioned above.

In case where the reflective mask obtained as mentioned above is set in an EUV exposure device and pattern transfer is carried out onto a semiconductor substrate with a resist film formed thereon, it is desired to apply the technique of reducing adhesion of contamination using hydrogen radicals or hydrogen plasma during EUV exposure. As described above, however, in the reflective mask according to Comparative Example, the reflective film which extends onto the end faces of the glass substrate has a multilayer structure with interfaces formed between the respective layers. Therefore, if the technique of reducing adhesion of contamination using hydrogen radicals or hydrogen plasma is applied during EUV exposure of the reflective mask in Comparative Example, a risk of occurrence of blisters at the end faces of the substrate is increased to cause, for example, contamination in the interior of an exposure chamber. Accordingly, excellent pattern transfer is difficult to be carried out.

What is claimed is:

1. A reflective film coated substrate comprising:
a substrate having:
two main surfaces opposite from each other, and
end faces connected to outer edges of the two main surfaces; and
a reflective film formed on one of the main surfaces as a multilayer structure comprising low refractive index layers and high refractive index layers alternately formed,
wherein a content (atomic %) of a first element in the low refractive index layers is higher than a content (atomic %) of any other element in the low refractive index layers, and a content (atomic %) of a second element in the high refractive index layers is higher than a content (atomic %) of any other element in the high refractive index layers, the second element being a different element from the first element, and
wherein the reflective film extends onto at least part of the end faces as a film without an interface between the low refractive index layer and the high refractive index layer, or as a film that is formed by mixing the first element and the second element.

2. The reflective film coated substrate according to claim 1, wherein, in the reflective film that extends onto at least part of the end faces, a ratio of the content (atomic %) of the first element to the total content (atomic %) of the first element and the second element is less than 0.4.

3. The reflective film coated substrate according to claim 1, wherein the film thickness of the reflective film that extends onto at least part of the end faces is smaller than the film thickness of the reflective film formed on the main surface.

4. The reflective film coated substrate according to claim 1, wherein the first element is molybdenum and the second element is silicon.

5. The reflective film coated substrate according to claim 1, wherein the reflective film that extends onto at least part of the end faces has surface roughness (root mean square roughness) Rq of 1.5 nm or more.

6. The reflective film coated substrate according to claim 1, wherein the ratio of the content of the first element contained in the reflective film which extends onto at least part of the end faces to the total content of the first element and the second element contained in the reflective film which extends onto at least part of the end faces is smaller than the ratio of the content of the first element contained in the reflective film formed on the main surface to the total content of the first element and the second element contained in the reflective film formed on the main surface.

7. A mask blank comprising:
a substrate having:
two main surfaces opposite from each other, and
end faces connected to outer edges of the two main surfaces;
a reflective film formed on one of the main surfaces as a multilayer structure comprising low refractive index layers and high refractive index layers alternately formed; and
a pattern-forming thin film formed on the reflective film,
wherein a content (atomic %) of a first element in the low refractive index layers is higher than a content (atomic %) of any other element in the low refractive index layers, and a content (atomic %) of a second element in the high refractive index layers is higher than a content (atomic %) of any other element in the high refractive index layers, the second element being a different element from the first element, and
wherein the reflective film extends onto at least part of the end faces as a film without an interface between the low refractive index layer and the high refractive index layer, or as a film that is formed by mixing the first element and the second element.

8. The mask blank according to claim 7, wherein, in the reflective film that extends onto at least part of the end faces, a ratio of the content (atomic %) of the first element to the total content (atomic %) of the first element and the second element is less than 0.4.

9. The mask blank according to claim 7, wherein the film thickness of the reflective film that extends onto at least part of the end faces is smaller than the film thickness of the reflective film formed on the main surface.

10. The mask blank according to claim 7, wherein the first element is molybdenum and the second element is silicon.

11. The mask blank according to claim 7, wherein the reflective film that extends onto at least part of the end faces has surface roughness (root mean square roughness) Rq of 1.5 nm or more.

12. The mask blank according to claim 7, wherein the ratio of the content of the first element contained in the reflective film which extends onto at least part of the end faces to the total content of the first element and the second element contained in the reflective film which extends onto at least part of the end faces is smaller than the ratio of the content of the first element contained in the reflective film formed on the main surface to the total content of the first element and the second element contained in the reflective film formed on the main surface.

13. A reflective mask comprising:
  a substrate having:
    two main surfaces opposite to each other, and
    end faces connected to outer edges of the two main surfaces;
  a reflective film formed on one of the main surfaces as a multilayer structure comprising low refractive index layers and high refractive index layers alternately formed; and
  a thin film formed on the reflective film and having a transfer pattern;
  wherein a content (atomic %) of a first element in the low refractive index layers is higher than a content (atomic %) of any other element in the low refractive index layers, and a content (atomic %) of a second element in the high refractive index layers is higher than a content (atomic %) of any other element in the high refractive index layers, the second element being a different element from the first element, and
  wherein the reflective film extends onto at least part of the end faces as a film without an interface between the low refractive index layer and the high refractive index layer, or as a film that is formed by mixing the first element and the second element.

14. The reflective mask according to claim 13, wherein, in the reflective film that extends onto at least part of the end faces, a ratio of the content (atomic %) of the first element to the total content (atomic %) of the first element and the second element is less than 0.4.

15. The reflective mask according to claim 13, wherein the film thickness of the reflective film that extends onto at least part of the end faces is smaller than the film thickness of the reflective film formed on the main surface.

16. The reflective mask according to claim 13, wherein the first element is molybdenum and the second element is silicon.

17. The reflective mask according to claim 13, wherein the reflective film that extends onto at least part of the end faces has surface roughness (root mean square roughness) Rq of 1.5 nm or more.

18. A method for manufacturing a semiconductor device, comprising transferring, by exposure, a transfer pattern onto a resist film on a semiconductor substrate by using the reflective mask according to claim 13.

19. The reflective mask according to claim 13, wherein the ratio of the content of the first element contained in the reflective film which extends onto at least part of the end faces to the total content of the first element and the second element contained in the reflective film which extends onto at least part of the end faces is smaller than the ratio of the content of the first element contained in the reflective film formed on the main surface to the total content of the first element and the second element contained in the reflective film formed on the main surface.

* * * * *